US005504366A

United States Patent [19]
Weiss et al.

[11] Patent Number: 5,504,366
[45] Date of Patent: Apr. 2, 1996

[54] SYSTEM FOR ANALYZING SURFACES OF SAMPLES

[75] Inventors: Paul S. Weiss; Stephan J. Stranick, both of State College, Pa.

[73] Assignees: Biotechnology Research and Development Corp.; Penn State Research Foundation, both of Peoria, Ill.

[21] Appl. No.: 120,560

[22] Filed: Sep. 13, 1993

Related U.S. Application Data

[63] Continuation-in-part of Ser. No. 916,165, Jul. 17, 1992, Pat. No. 5,268,573, and Ser. No. 979,597, Nov. 20, 1992, Pat. No. 5,281,814.

[51] Int. Cl.$^6$ .................................................. H01J 37/20
[52] U.S. Cl. ................ 73/863; 250/440.11; 250/442.11; 250/306; 250/307
[58] Field of Search .......................... 250/442.11, 440.11, 250/306, 307, 310; 73/863

[56] References Cited

U.S. PATENT DOCUMENTS

| | | | |
|---|---|---|---|
| 3,566,262 | 2/1971 | Thompson et al. | 324/65 |
| 3,958,124 | 5/1976 | Koch et al. | 250/442.11 |
| 4,939,363 | 7/1990 | Bando et al. | 250/442.11 |
| 4,941,753 | 7/1990 | Wickramasinghe | 374/120 |
| 4,992,600 | 2/1991 | Kobayashi | 250/440.11 |
| 5,060,248 | 10/1991 | Dumoulin | 378/53 |
| 5,103,095 | 4/1992 | Elings et al. | 250/440.11 |
| 5,130,554 | 7/1992 | Nose et al. | 250/491.1 |
| 5,247,181 | 9/1993 | Oonuki et al. | 250/440.11 |

FOREIGN PATENT DOCUMENTS

WO9117429 11/1991 France.

OTHER PUBLICATIONS

"A Tunable Microwave Frequency Alternating Current Scanning Tunneling Microscope," by Stranick et al., *Review of Scientific Instruments*, vol. 65, No. 4, Apr. 1994, New York, pp. 918–921.

"A Novel Ultrahigh Vacuum Scanning Tunneling Microscope for Surface Science Studies," by Haase et al., *Review of Scientific Instruments*, vol. 61, No. 5, May 1990, New York, pp. 1480–1483.

Product brochure entitled "Surface/Interface Components Overview," *Instruments and Materials for Surface and interface Analysis*, Mountain View, CA pp. 5–16; Sep. 1, 1993.

"AC Scanning Tunneling Microscopy and Spectroscopy," by Stranick et al., Version Date Aug. 28, 1992.

"Near–Field Optics: Microscopy, Spectroscopy, and Surface Modification Beyond ... ," Betzig et al., *Science*, V. 25, pp. 189–195, Jul. 10, 1992.

"Breaking the Diffraction Barrier: Optical Microscopy on a Nanometric Scale," Betzig et al., *Science*, V. 251, pp. 1468–1470, Mar. 22, 1991.

"Super–Resolution Aperture Scanning Microscope," Weiss, *Nature*, V. 237, pp. 510–512, Jun. 10, 1972.

"Scanning Surface Harmonic Microscopy: Scanning Probe Microscopy ... ," Michel et al., *Rev. Sci. Instrum.*, V. 63, No. 9, pp. 4080–4085, Sep. 1992.

"Nonlinear Alternating–Current Tunneling Microscopy," Kochanski, *Physical review Letters*, 62(19):2285–2288 (May 8, 1989).

"Nonlinear Alternating–Current Tunneling Microscopy" (AT&T Preprint (Aug. 17, 1988), published in *Phys. Rev. Ltrs*, 62(19):2285–2288 (May 8, 1989).

(List continued on next page.)

*Primary Examiner*—Jack I. Berman
*Assistant Examiner*—Kiet T. Nguyen
*Attorney, Agent, or Firm*—Majestic, Parsons, Siebert & Hsue

[57] ABSTRACT

A system for transporting in a vacuum chamber sample holders and samples between a holder tray and a location for use with a surface analytical instrument is disclosed. Also provided is a system including a microwave coaxial cable connecting the tip terminal of a scanning tunneling microscope to a microwave signal source and a system for clamping a heater to a sample holder in order to heat the sample.

36 Claims, 12 Drawing Sheets

OTHER PUBLICATIONS

"Scanning Tunneling Microscopy at Microwave Frequencies," *Ultramicroscopy*, Seifert et al., pp. 42–44; 379–387 (1992).

"Scanning Tunneling Microscopy at Microwave Frequencies," *Ultramicroscopy*, (Preprint, Korrigierte Version, Nov. 6, 1991), pp. 42–44; 379–387 (1992).

"Scanning Tunneling Microscopy I," Anselmetti et al., pp. 5–6., Jul. 2, 1992.

"Laser–Frequency Mixing Using the Scanning Tunneling Microscope," Arnold et al. *J. Vac. Sci. Technol.*, A, 6(2):466–469 (Mar./Apr. 1988).

"Laser–Frequency Mixing in the Junction of a Scanning Tunneling Microscope," *Appl. Phys. Lett.*, 51(11)786–788 (Sep. 14, 1987), Arnold et al.

"Laser–Driven Scanning Tunneling Microscope," Volcker et al., *Phys. Rev.* Lett., 66(13)1717–1720 (Apr. 1, 1991).

"Scanning Tunneling Microscopy of Photoexcited Carriers at the Si (001) Surface," Cahill et al., *J. Vac. Sci. Techn.*, B, 9(2):564–567 (Mar./Apr. 1991).

"Atomically Resolved Carrier Recombination at Si(111)–(7×7) Surfaces," Hamers et al., *Phys. Rev. Lett.*, 64(9):1051–1054 (Feb. 26, 1990).

"Optical Interactions in the Junction of a Scanning Tunneling Microscope," Kuk et al., *Phys. Rev. Lett.*, 65(4):456–459 (1990).

"Optical Interactions in the Junction of a Scanning Tunneling Microscope," Kuk et al., Preprint published in *Phys. Rev. Lett.*, 65(4):456–459 (1990).

"Correlated Discrete Transfer of Single Electrons in Ultrasmall Tunnel Junctions," Likharev, *IBM J. Res. Develop.*, 32(1):144–158 (Jan. 1988).

"Single Electronics" Likharev et al., *Scientific American*, Jun. 1992.

"Ultramicroelectrodes: Cyclic Volammetry Above One Million Vs", *J. Electro anal. Chem.*, 248:447–450 (1988).

"High–Speed Cyclic Voltammetry," Wightman et al., *Acc. Chem. Res.*, 23:64–70 (1990).

"Single Charge Tunneling Coulomb Blockade Phenomena . . . , " Grabert et al., NATO ASI Series, Series B: Physics, vol. 294, pp. 1–19, 1992.

"Time– Correlated Single–Electron Tunneling in One–Dimensional Arrays of Ultrasmall . . . , " Delsing et al., *Phys. Rev. Lett.*, 63(17):1861–1864, Oct. 23, 1989.

Wilson et al. "Imaging $c_{60}$ Clusters on a Surface using a Scanning Tunnelling Microscope" pp. 621–622; Dec. 13, 1990.

"A Versatile Microwave–Frequency–Compatible Scanning Tunneling Microscope," Stranick et al., *Rev. Sci. Instrum.*, 64(5):1232–1234, May 1993.

"Coarse Tip Distance Adjustment and Positioner for a Scanning Tunneling Microscope," Frohn et al., *Rev. Sci. Instrum.*, 60(6):1200–1201, Jun. 1989.

"Nanosources and Manipulation of Atoms Under High Fields and Temperatures: Applications," edited by Binh et al., NATO ASI Series, V. 235, pp. 19–33.

Product brochure entitled"The Beetle STM–A Versatile, UHV Compatible Scanning Tunneling Microcope."

"An Easily Operable Scanning Tunneling Microscope," Besocke, *Surface Science*, 181:145–153, 1987.

"Generation of Microwave Radiation in the Tunneling Junction of a Scanning Tunneling Microscope," by Krieger et al., The American Physical Society, vol. 41, No. 14, May 15, 1990, pp. 10229–10232.

"A New Impedance Spectrometer for the Investigation of Electrochemical Systems," by Pobkirov et al., Rev. Sci. Instrum., vol. 63, No. 11, pp. 5366–5372.

"Scanning Tunneling Microscopy, Resonant Tunneling, and Counting Electrons: A Quantum Standard of Current," by Guinea et al., Physical Review Letters, vol. 65, No. 3, pp. 281–284, Jul. 16, 1990.

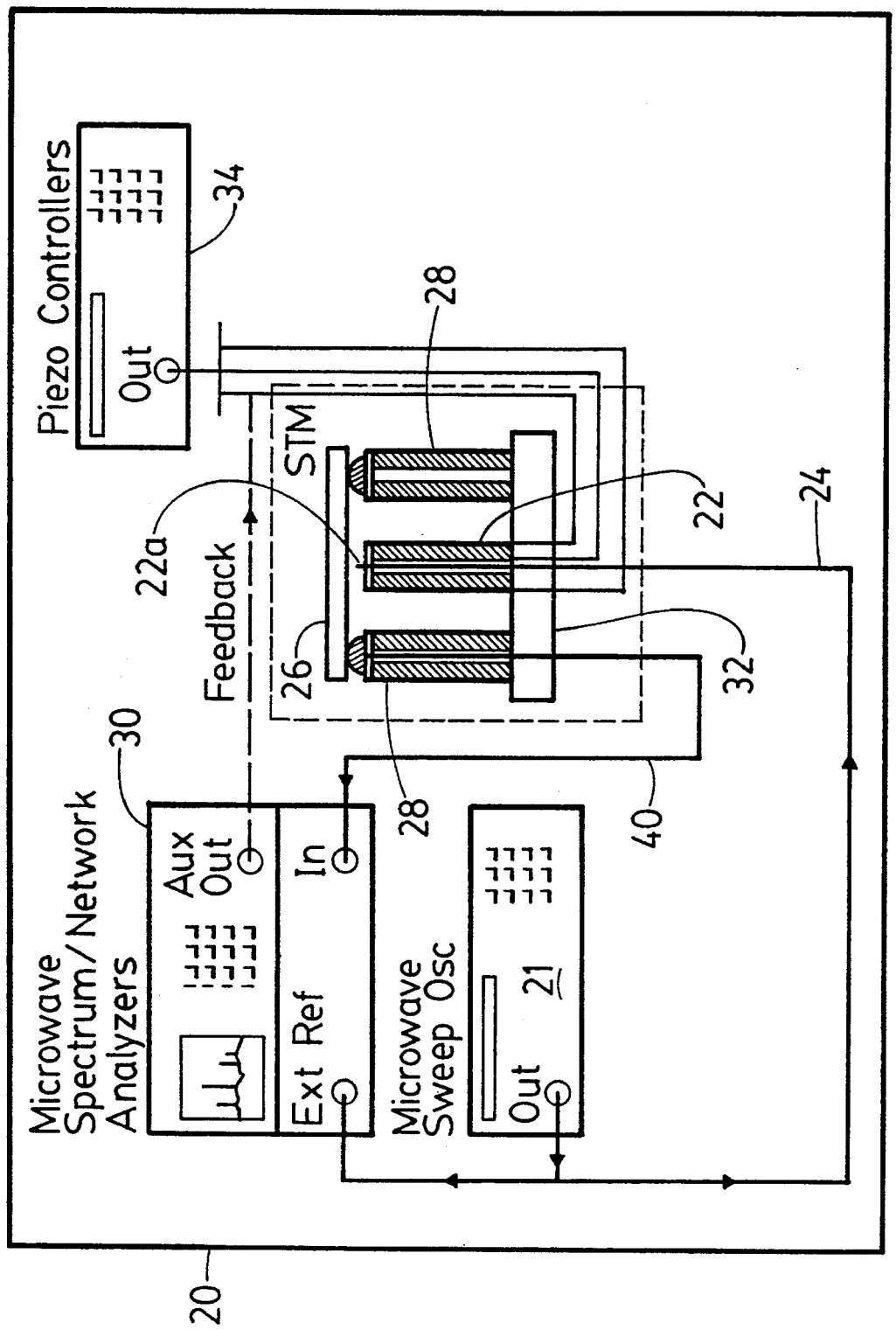
FIG._1.

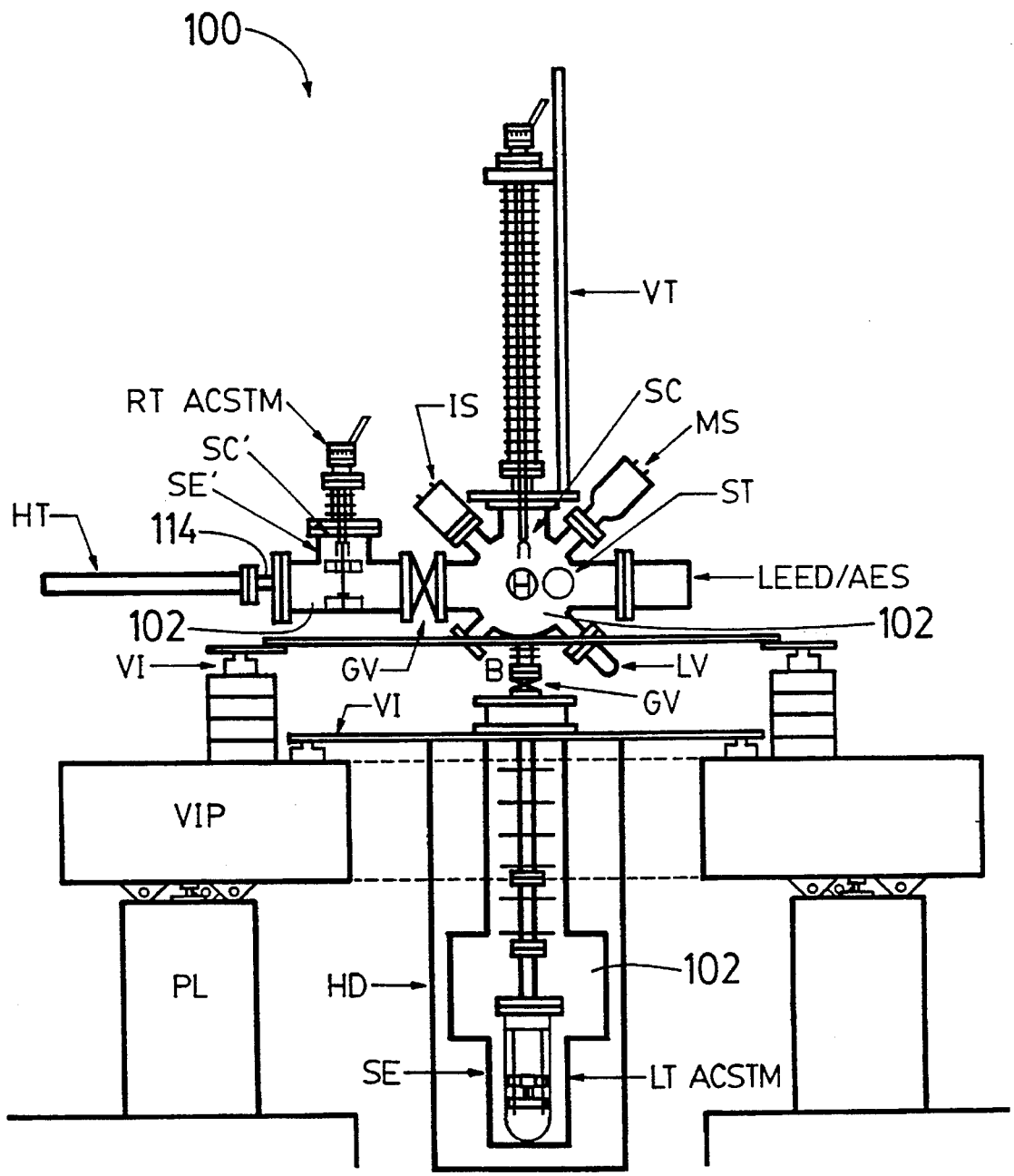
FIG._2.

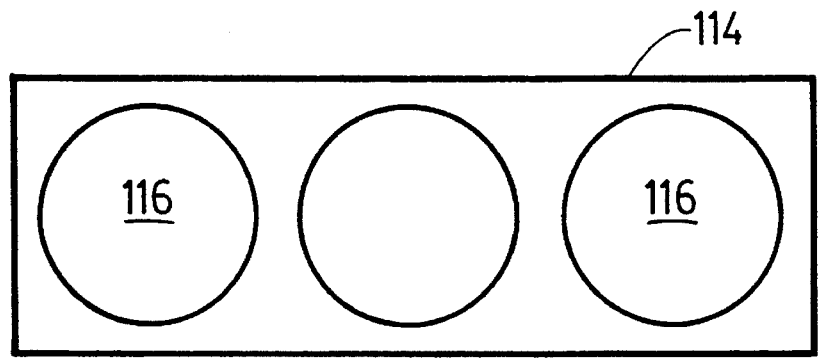
TOP VIEW
FIG._3A.
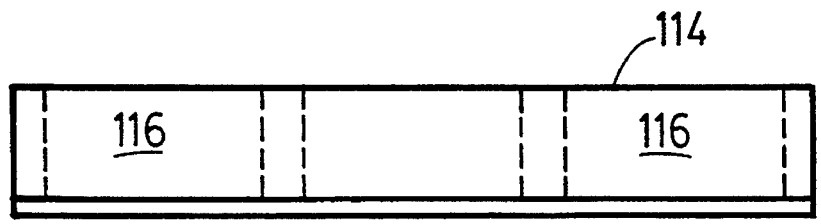
SIDE VIEW
FIG._3B.
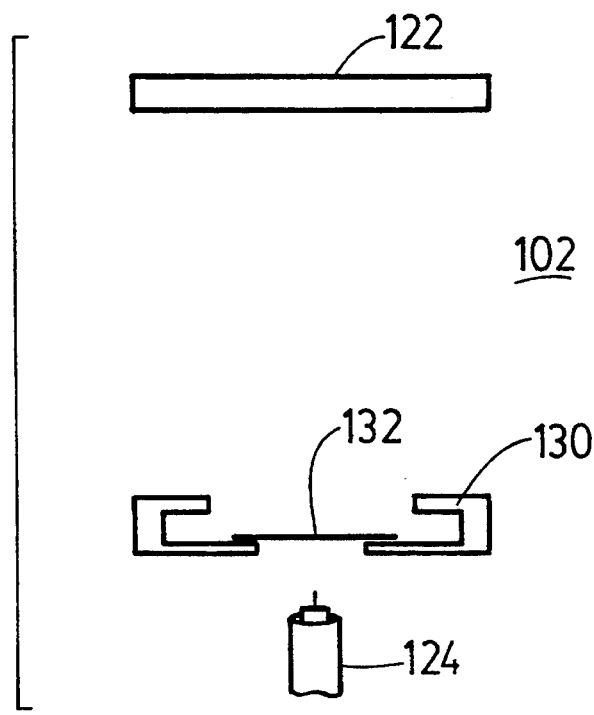
FIG._4.

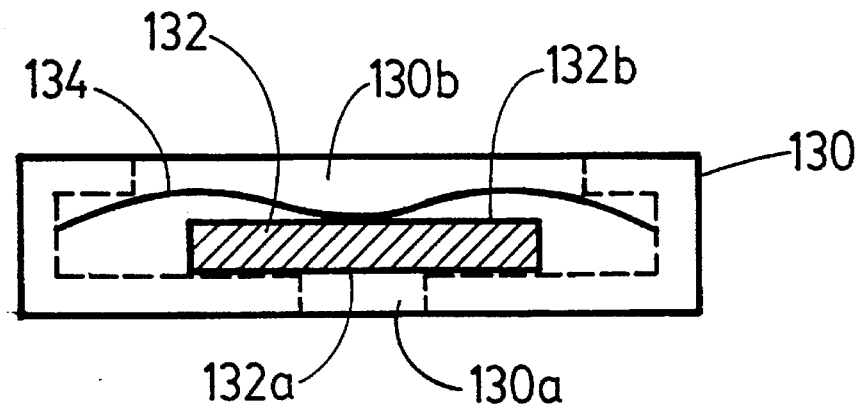
FIG. _5A.
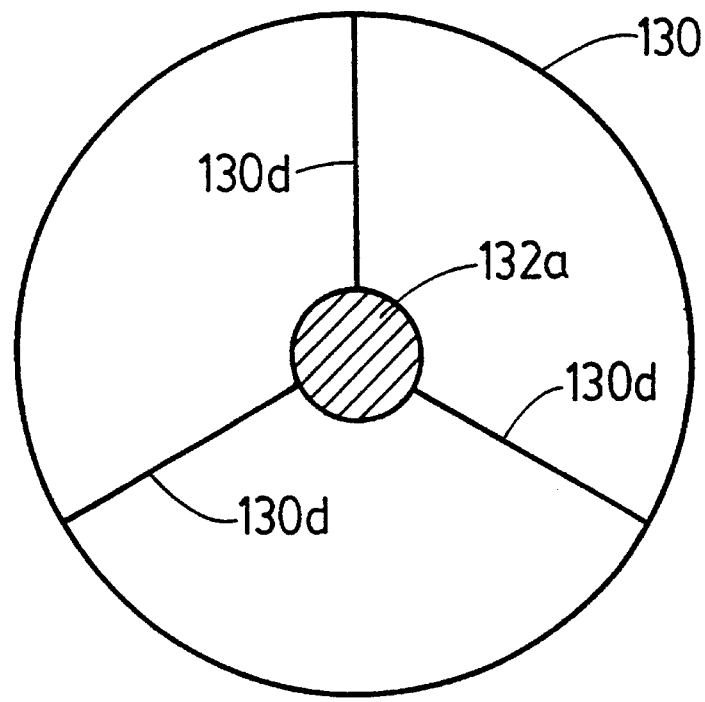
FIG. _5B.

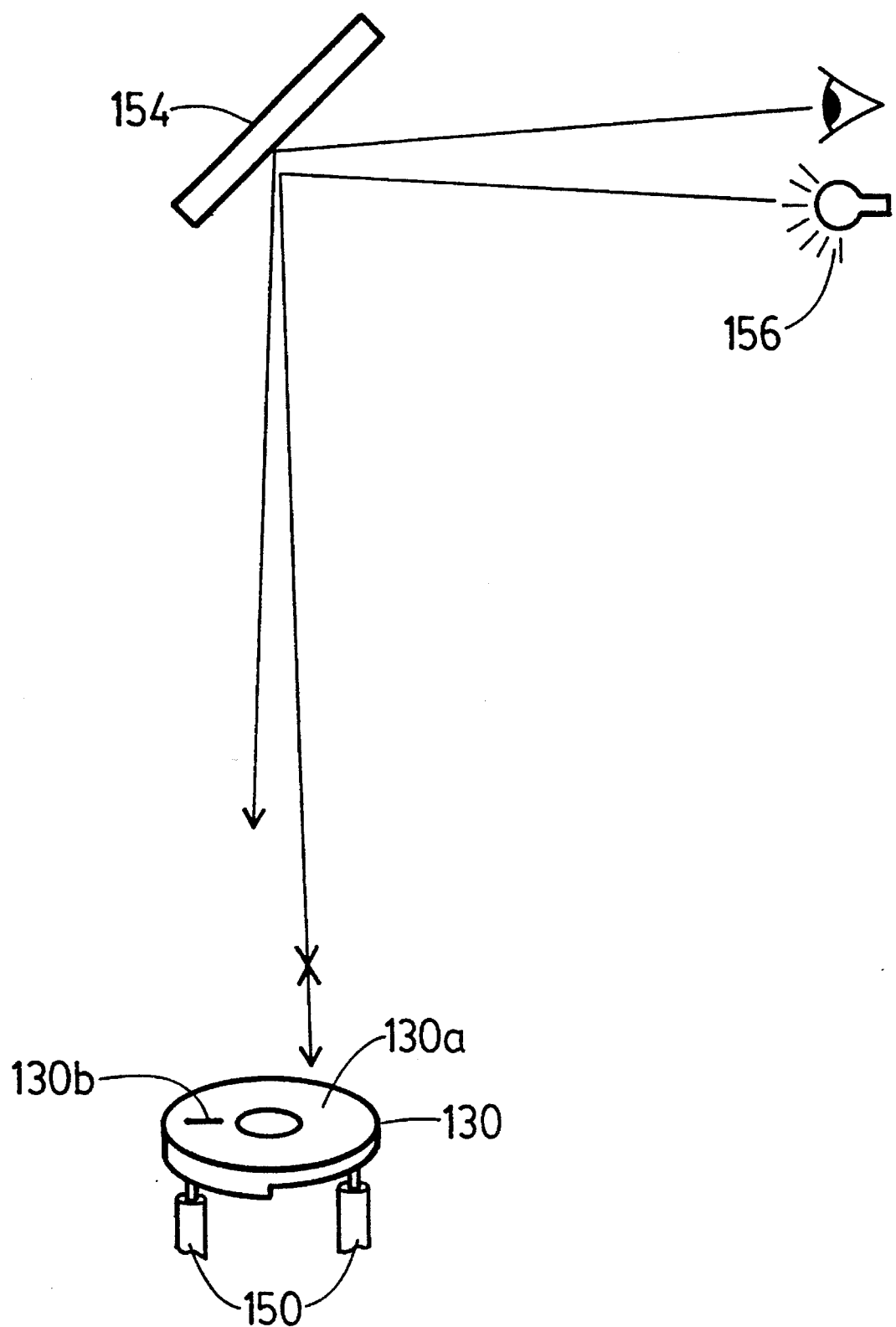
FIG._6.

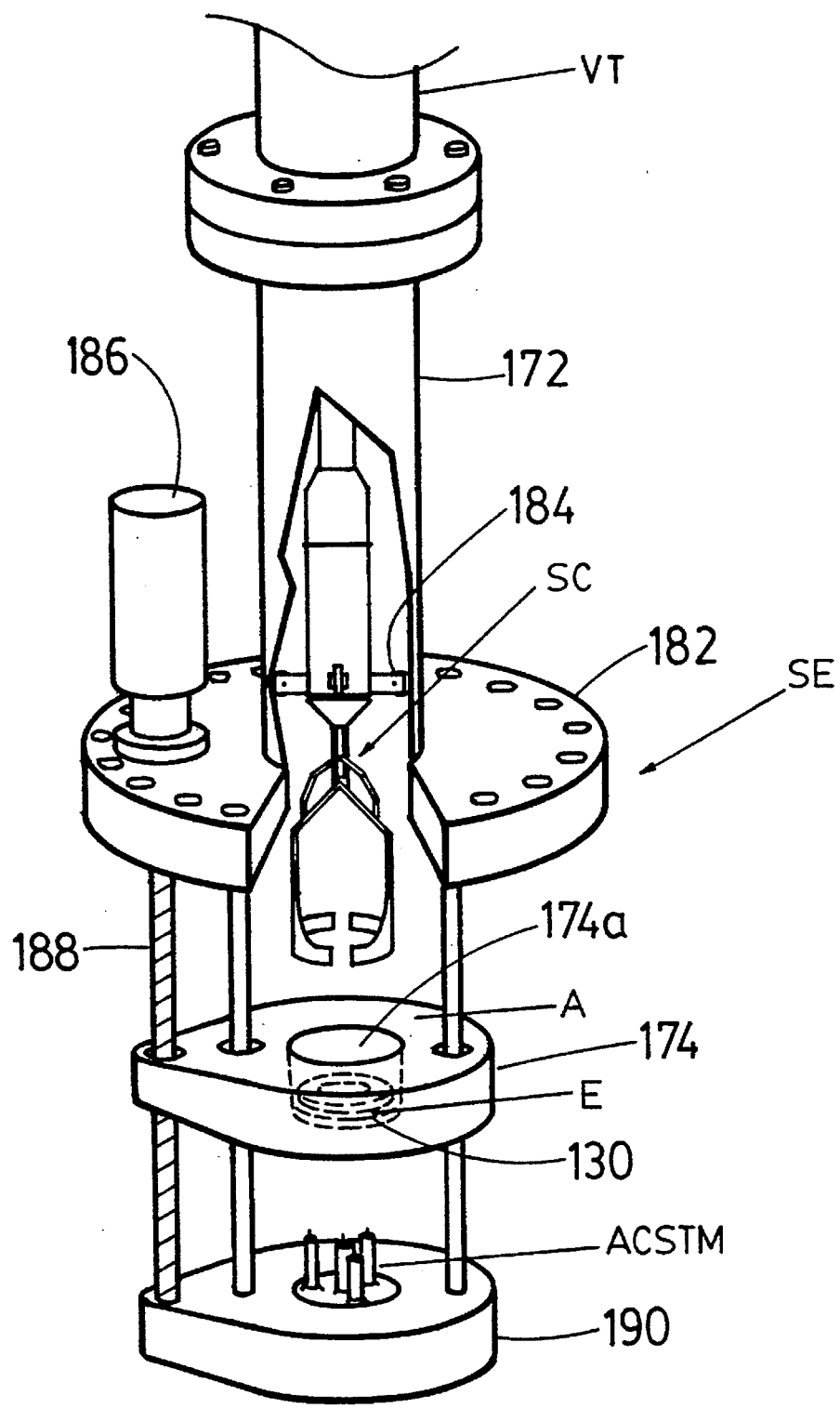
FIG._7A.

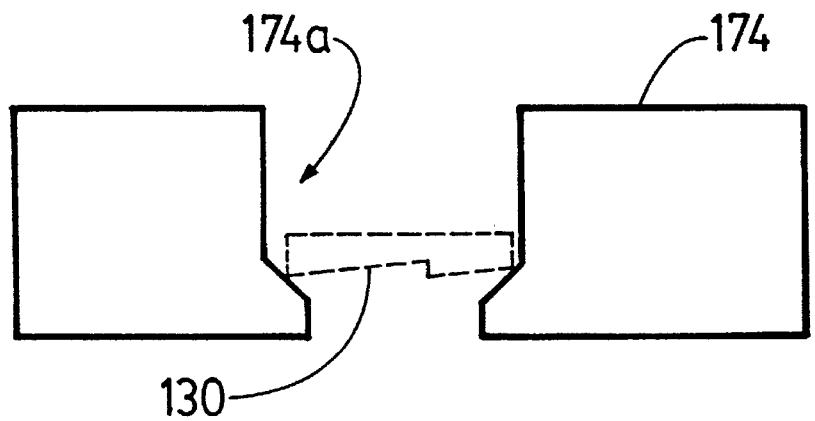
FIG._7B.
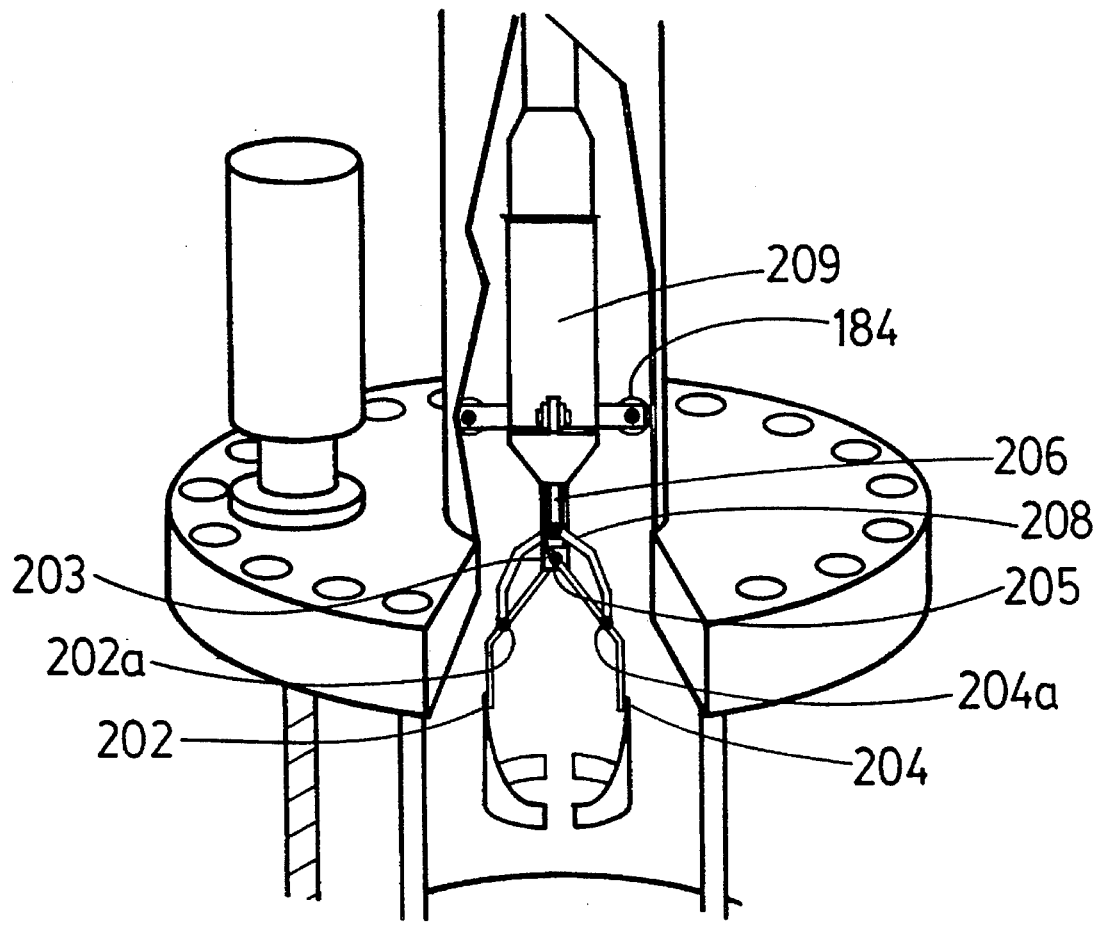
FIG._8.

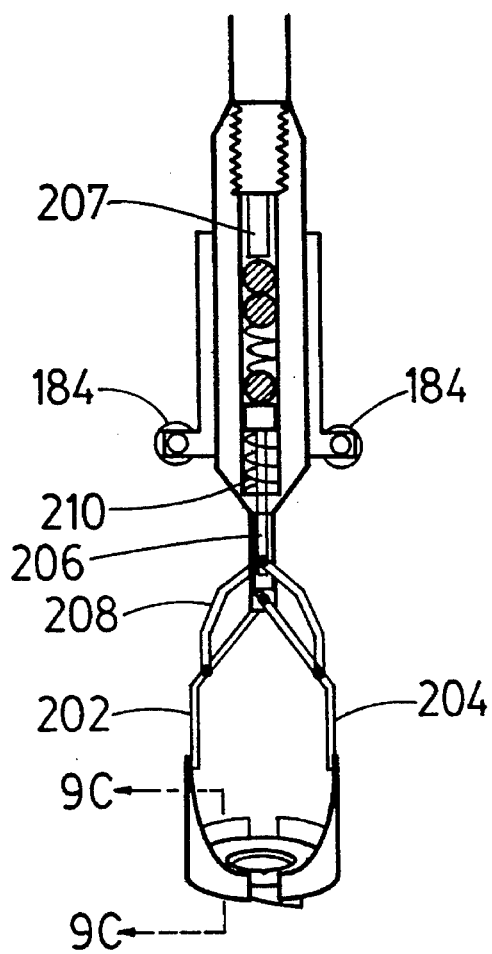
FIG._9A.
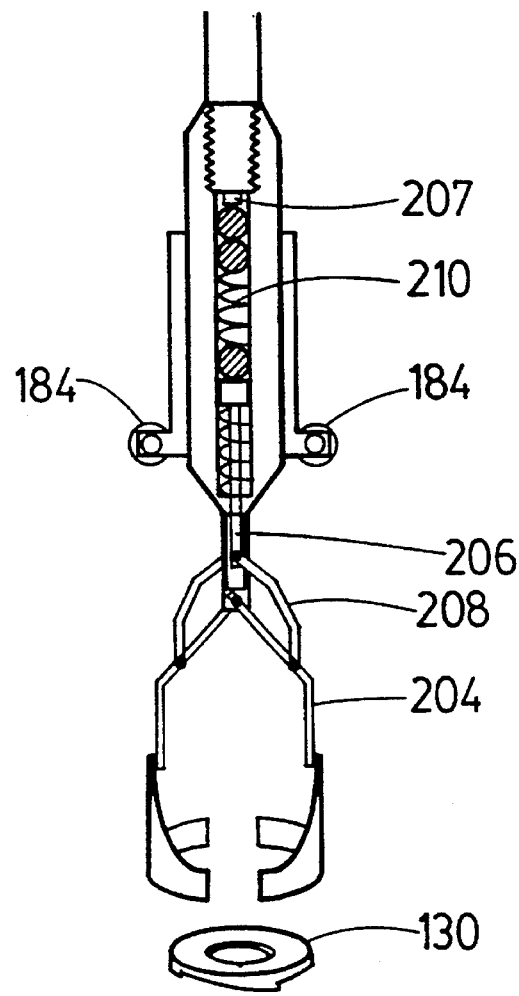
FIG._9B.
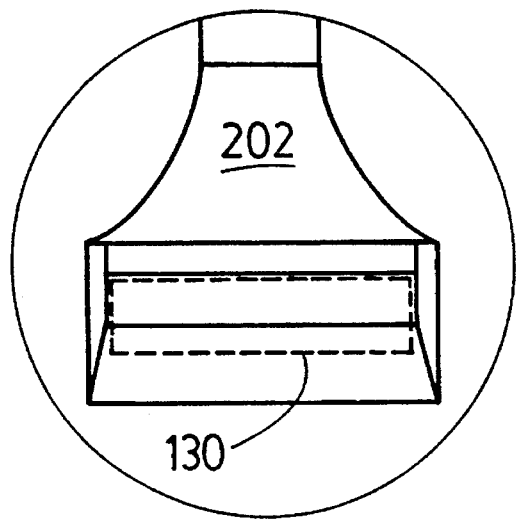
FIG._9C.

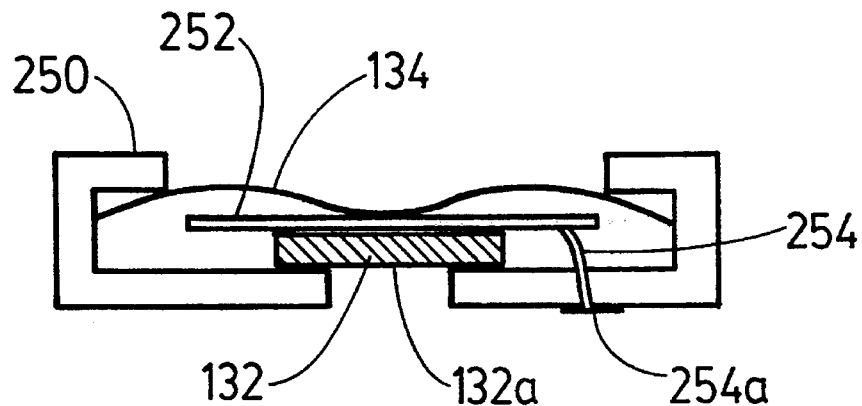
FIG._10A.
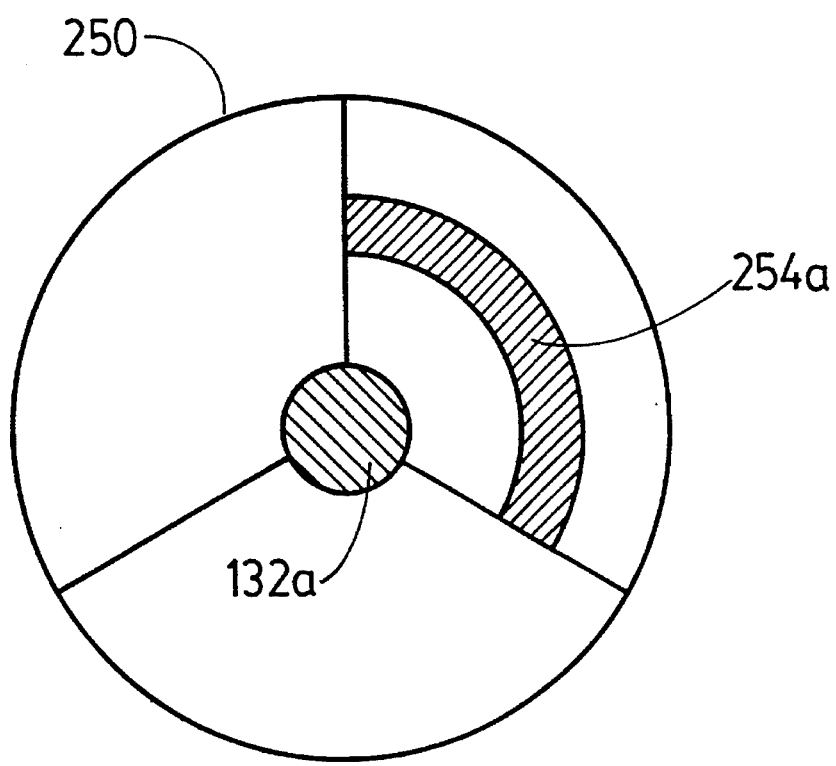
FIG._10B.

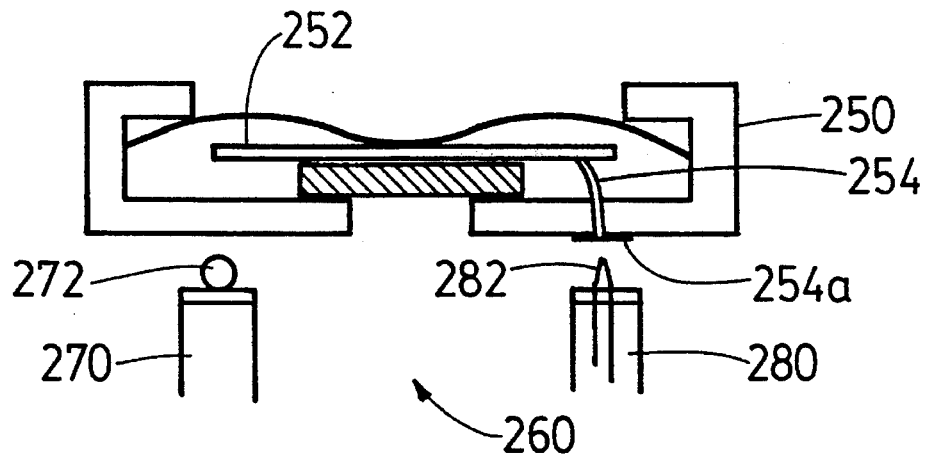
FIG._11.
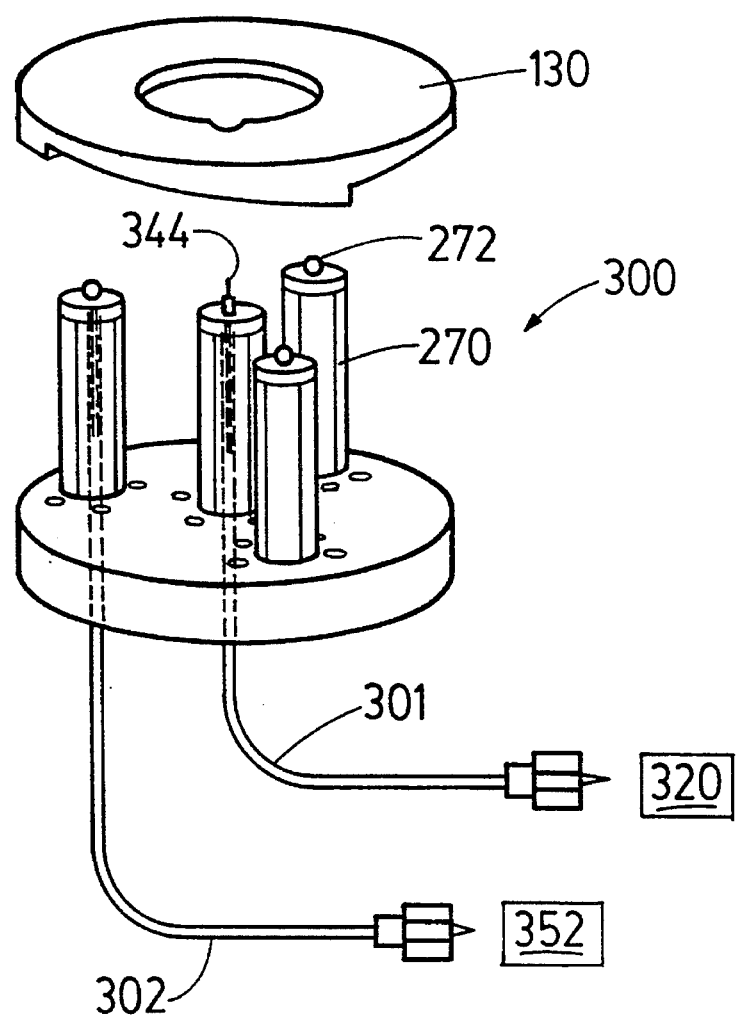
FIG._12.

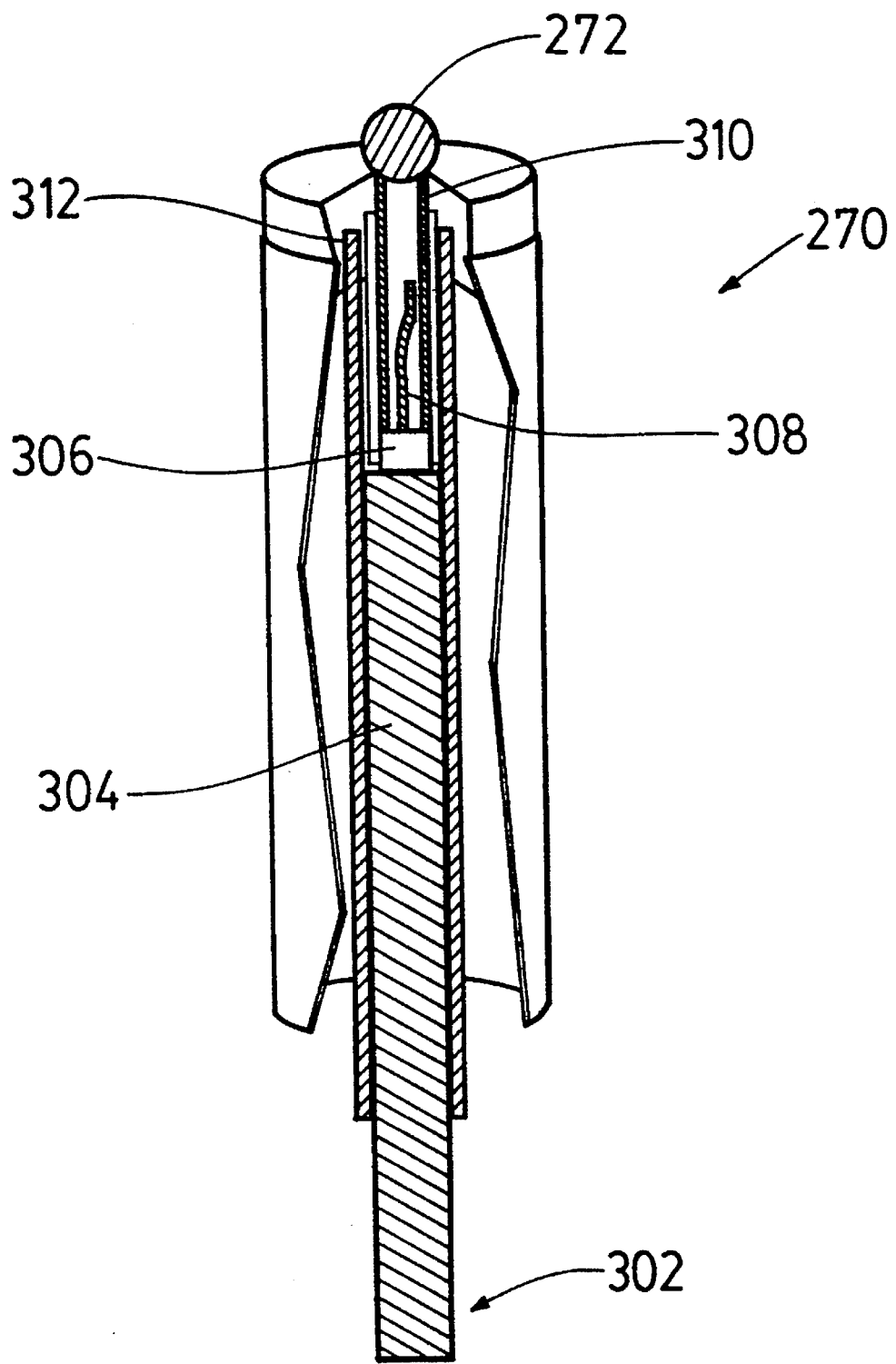
FIG._13.

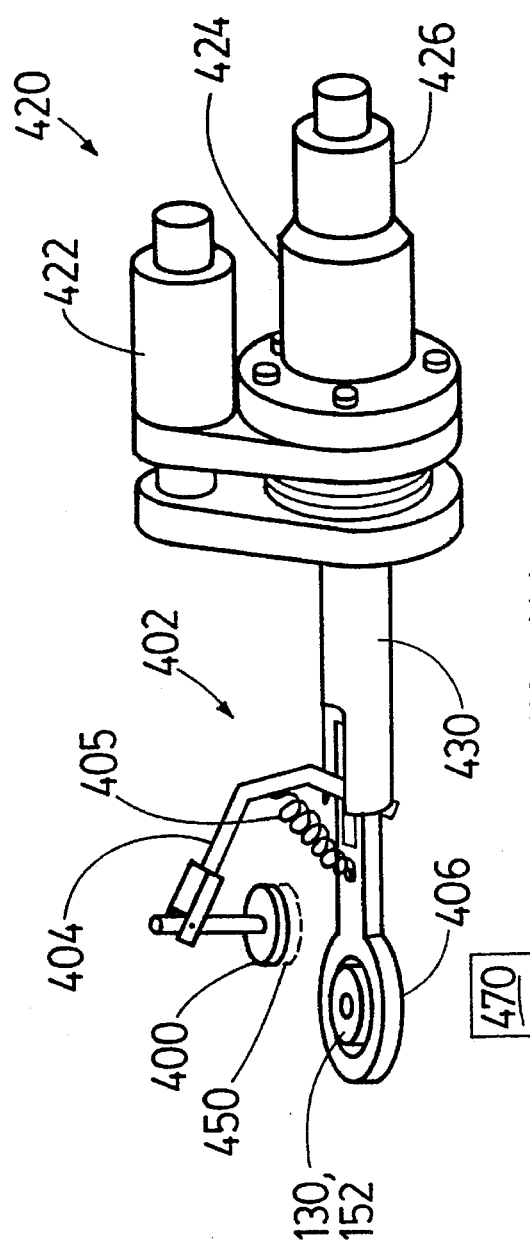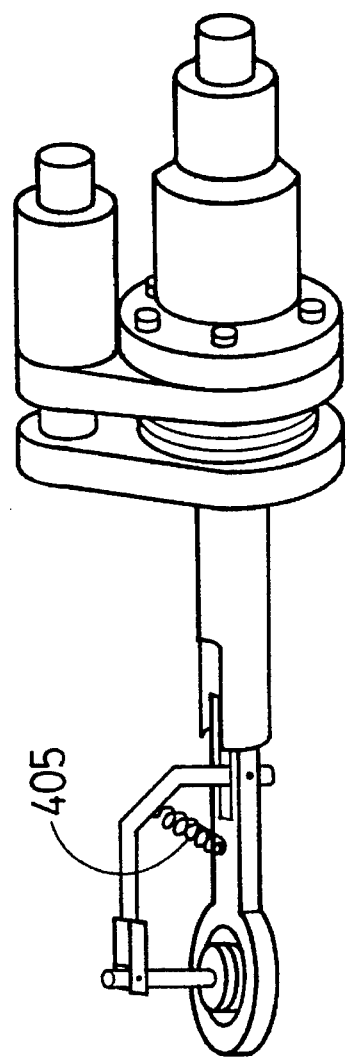
FIG._14A.
FIG._14B.

SYSTEM FOR ANALYZING SURFACES OF SAMPLES

CROSS-REFERENCE TO RELATED APPLICATION

This is a continuation-in-part application of the application entitled "System for Detecting Threshold Phenomena Associated with and/or Atomic Spectra of a Substance," Ser. No. 916,165, filed Jul. 17, 1992, now U.S. Pat. No. 5,268,513 and of the application Ser. No. 979,597 filed Nov. 20, 1992 now U.S. Pat. No. 5,281,814 entitled "System for Imaging and Detecting Threshold Phenomena Associated with and/or Atomic or Molecular Spectra of a Substance by Reflection of an A/C electrical Signal," referred to herein as the "parent applications."

BACKGROUND OF THE INVENTION

This invention relates to a system for detecting and analyzing surfaces of samples.

With the advent of instruments such as the scanning tunneling microscope (STM), it is now possible to investigate the structure, spectra and dynamics of biological molecules and membranes as well as other substances at the atomic or molecular level. While more than a thousand STM's have been in operation and the instrument has sparked great interest in spectroscopy, the actual headway that has been made in this area remains rather modest. Thus, Bob Wilson and co-workers at IBM Almaden have made some progress in distinguishing closely related adsorbed surface species in STM images. G. Meijer et al., *Nature* 348, 621 (1990). In "Non-Linear Alternating-Current Tunneling Microscopy," Kochanski, *Physical Review Letters*, 62(19):2285–2288, May 1989, a method for scanning tunneling microscopy is described, where a non-linear alternating current (AC) technique is used that allows stable control of a microscope tip above insulating surfaces where direct current (DC) tunneling is not possible.

The STM has a counter electrode on which the sample to be investigated is placed and another electrode in the shape of a microscope probe with a tip placed at a small distance away from the sample surface. A DC or a low frequency AC signal is then applied across the pair of electrodes. The probe tip is then moved across the sample surface in a scanning operation and the changes in the current or voltage across the electrodes are monitored to detect the characteristics of the sample.

A number of specific implementations of the scanning tunneling microscope have been proposed. See, for example, "A Versatile Microwave-Frequency-Compatible Scanning Tunneling Microscope," by Stranick and Weiss, *Rev. Sci. Instrum.*, 64(5):1232–1234, May 1993; "Coarse Tip Distance Adjustment and Positioner for a Scanning Tunneling Microscope," by Frohn et al., *Rev. Sci. Instrum.*, 60(6):1200–1201, June 1989; a product brochure from Besocke Delta Phi GmbH of Juelich, Germany, entitled "The Beetle STM—A Versatile, UHV Compatible Scanning Tunneling Microscope," and "An Easily Operable Scanning Tunneling Microscope," by Besocke, *Surface Science*, 181:145–153, 1987. However, none of the above implementations has the capability of changing samples or microscope within the vacuum chamber.

Frequently, it is desirable to first prepare and/or characterize the sample in a vacuum chamber using instruments for ion sputtering or electron or mass spectroscopy, and then transfer the prepared/characterized sample to an STM for surface study. Since the implementations in the above-referenced articles and brochure are apparently not capable of transferring samples within the vacuum chamber, it would be difficult or impossible to accomplish the above-described process using such implementations. There is also a need to be able to transfer samples or change instruments in vacuum involving surface analytical instruments other than the STM. It is therefore desirable to provide an improved system for implementing surface detection and to handle different equipment required for preparation, detection and analysis of sample surfaces where it is possible to transfer samples and change instruments.

SUMMARY OF THE INVENTION

One aspect of the invention is directed towards an apparatus for analyzing surfaces of samples. The apparatus can be used for handling not only instruments such as STMs but any other type of surface analytical instruments. The apparatus comprises a vacuum chamber, at least one surface analytical instrument in the chamber and at least one sample holder each for holding a sample in the chamber. The apparatus further comprises a device in the chamber for picking up a sample holder holding a sample and placing the holder at a location for use with said at least one instrument and for picking up a sample holder holding a sample and located for use with the at least one instrument and placing the holder at a different location, so that the device is adapted for transporting, in the chamber, sample holders and samples for use with the instrument.

Another aspect of the invention is directed towards a method for analyzing surfaces of samples comprising picking up a sample holder holding a sample and placing the holder at a location for use with at least one surface analytical instrument, all in a vacuum chamber, detecting and analyzing a surface of the sample using the instrument and, thereafter, placing the holder at a predetermined location in the vacuum chamber.

Yet another aspect of the invention is directed towards an apparatus for analyzing surfaces of samples using an ACSTM. The apparatus comprises an ACSTM having a tip terminal for supplying an AC signal to a surface of a sample, a microwave signal source, and a microwave coaxial cable connecting the tip terminal to the source.

Yet another aspect of the invention is directed towards an apparatus for analyzing surfaces of samples requiring heating of the sample. The apparatus comprises a vacuum chamber, at least one surface analytical instrument in the chamber, and at least one sample holder for holding a sample in the chamber. The apparatus further comprises a heater and a clamp assembly for holding the heater and a sample holder, said assembly including a mechanism for controlling the clamping of the heater to the holder, where the heater and the assembly are in the chamber.

Still another aspect of the invention is directed to a method useful for analyzing surfaces of samples, comprising clamping a heater to a sample holder holding a sample in a vacuum chamber, heating the sample using the heater and preparing the sample or detecting and analyzing a surface of the sample using at least one surface analytical instrument in the chamber.

BRIEF DESCRIPTION OF THE DRAWINGS

FIG. 1 is a schematic diagram of an ACSTM to illustrate the invention.

FIG. 2 is a schematic diagram of a vacuum system for preparing, characterizing, detecting and analyzing the surface of a sample to illustrate the preferred embodiment of the invention.

FIGS. 3A, 3B are the respective top and side views of a sample holder tray for use in the vacuum chamber in FIG. 2 to illustrate the preferred embodiment of the invention.

FIG. 4 is a schematic view of a system for point-source shadow imaging, field emission microscopy, field ion microscopy, or atom probe microscopy.

FIGS. 5A, 5B are respectively a cross-sectional view and a bottom view of a sample holder and a sample held in the holder to illustrate one embodiment of the sample holder.

FIG. 6 is a schematic view of a sample holder and an optical system to illustrate the invention.

FIG. 7A is a perspective cutaway view of a translator, a sample elevator and a claw assembly to illustrate the preferred embodiment of the invention.

FIG. 7B is a cross-sectional view of the plate of the sample elevator of FIG. 7A and of a holder shown in phantom.

FIG. 8 is an enlarged view of a portion of the translator, elevator and claw assembly of FIG. 7A.

FIGS. 9A, 9B are partly cross-sectional and partly perspective views of the claw assembly of FIGS. 7 and 8, where FIG. 9A illustrates the position of the claw assembly in a closed position for picking up and holding onto a sample holder where FIG. 9B illustrates the position of the claw assembly in its open position when the sample holder is released.

FIG. 9C is an enlarged side view of a portion of the claw assembly as viewed from direction 9C in FIG. 9A with the sample holder shown in phantom.

FIGS. 10A and 10B are respectively a cross-sectional view and a bottom view of a sample and sample holder with microwave transmission lines to illustrate the preferred embodiment of the invention.

FIG. 11 is a cross-sectional view of a sample holder, sample and two piezoelectric assemblies of an AC STM to illustrate the preferred embodiment of the invention.

FIG. 12 is a perspective view of the tip mounted piezoelectric tube together with three peripheral piezoelectric tubes of a beetle-style STM connected to coaxial cables and a Sample holder to illustrate the preferred embodiment of the invention.

FIG. 13 is a cutaway cross-sectional view of one of the peripheral tubes and of a coaxial cable of FIG. 12 to illustrate the preferred embodiment of the invention.

FIGS. 14A, 14B are perspective views of a heater clamp assembly in its open and closed positions respectively to illustrate the preferred embodiment of the invention.

DETAILED DESCRIPTION OF THE PREFERRED EMBODIMENT

FIG. 1 is a schematic diagram of a system 20 including a beetle-style high frequency scanning tunneling microscope for imaging samples using throughput attenuation with a network analyzer, or using non-linear harmonic recording with a spectrum analyzer to illustrate the preferred embodiment of the invention. As shown in FIG. 1, a microwave sweep oscillator 21 generates an AC signal and applies it to microscope probe 22 with tip 22a through line 24. Tip 22a is placed close to but spaced apart (by vacuum, a gas or a fluid) from a sample 26 which is placed on top of the piezoelectric tube assembly 28 comprising one or more peripheral tubes and described further below. A signal line inside assembly 28 is connected to microwave spectrum/network analyzers 30. The position of the probe tip 22a over sample 26 is controlled by changing the length of piezoelectric tube 22 by applying a voltage to it as controlled by piezo controllers 34. Controllers 34 receive from analyzers 30 a signal to be used for feedback. Since the tip and sample contacts of a beetle-style STM are rigid and stationary, such STM is ideal for use with semi-rigid coaxial cables in an ACSTM permitting samples to be changed and brought to the STM.

In operation, the microwave sweep oscillator 21 applies the AC signal to tip 22a and analyzers 30 applies typically a reference voltage such as a virtual ground to assembly 28. The current or voltage between electrodes 22, 28 is monitored by analyzers 30 which derive a feedback signal for controlling controllers 34. In the constant current mode, this feedback signal is applied to the piezo controllers 34 for moving the tip 22a away from or towards the sample 26 in order to maintain a constant signal amplitude between electrode 22 and assembly 28. In constant height mode, the distance between tip 22a and the sample 26 is maintained at a constant average value and the feedback signal derived from the output of analyzers 30 is either not applied to controllers 34 or attenuated to a very low value before it is applied to controllers 34.

The system 20 of FIG. 1 can be modified by detecting a reflected signal at tip 22a instead of the transmitted signal at assembly 28. In such event, no connection between analyzer 30 and assembly 28 is necessary. The reflected signal is sent back through a coaxial cable 24 to analyzer 30 and can also be used as feedback to control controller 34.

Frequently, it is desirable to perform the study of the surface of the sample 26 in a vacuum to reduce undesirable contamination of the sample surface. For this purpose, the microscope probe 22, the assembly 28, and sample 26 as well as some of the lines connecting the probe and the assembly to analyzer 30 will have to be placed in a vacuum chamber. When this is done, it may be difficult to change to a different microscope or sample within the vacuum chamber. As known to those skilled in the art, often it is desirable to either prepare and characterize the sample by using another STM or devices for ion sputtering or mass or electron spectroscopy prior to the measurement as described above using the probe 22. It is therefore desirable to perform such preparative and characterization work as well as the subsequent detection using probe 22 all within the same vacuum chamber to reduce the chances of contamination of the sample while the sample is being transferred from equipment used for preparative or characterization to the equipment for surface detection and analysis. A solution for the above problem is illustrated in FIG. 2.

FIG. 2 is a schematic diagram of a system 100 for performing preparative and sample characterization of samples and for detection and analysis of sample surfaces to illustrate the preferred embodiment of the invention. As shown in FIG. 2, system 100 includes a vacuum chamber 102 into which at least one surface analytical instrument operates, and into which at least one sample holder, and an optional container 114 for containing the holder are placed. In the chamber is also a device for picking up a sample holder for holding the sample and placing the holder at a location for use with the instrument and for returning the sample holder and the sample to the container (or simply a predetermined location) so that the device is adapted for transporting in the chamber sample holders and samples between the container (or a predetermined location) and a location for use with the instrument.

In the preferred embodiment as shown in FIG. 2, the vertical translator VT is adapted to pick up a sample holder holding a sample and placing the holder at a location for use with an instrument. The sample or samples in the chamber 102 are accesible to a number of instruments, including a device IS for ion sputtering, a device MS for mass spectroscopy, a device LEED/AES for low energy electron diffraction and for Auger electron spectroscopy, a Room Temperature RT ACSTM and a Low Temperature LT ACSTM. These instruments may be used for cleaning the sample surface and checking how clean the surface is as well as its crystallinity before detection and analysis. For example, if contamination is discovered, ion sputtering may be performed to clean the sample surface. After the cleaning process, the sample surface is again checked using one or more of the above-listed instruments. During the cleaning and checking processes, it may be desirable to heat the sample using the heater H in chamber 102. After the sample has been cleaned and characterized as described above, it is then delivered to the low temperature LT ACSTM shown in FIG. 2 for detection at low temperature. As is known to those skilled in the art, it may be desirable to perform the detection and imaging at low temperatures for some samples. A portion of chamber 102 may be cooled to cryogenic temperatures (4K, 77K or other temperatures) by submersion in liquid helium, liquid nitrogen 103 or by other means so that the LT ACSTM in such portion can detect at low temperatures. Instead of ion sputtering, atom or molecule or ion scattering may also be used for preparing and analyzing the sample surface. For simplicity, ion sputtering and atom or molecule or ion scattering are all applicable and are referred to herein as ion, atom and molecule scattering.

Horizontal translator HT, and one or more vertical translators VT, are used for moving the sample and sample holder within the vacuum chamber 102 between different instruments. The horizontal translator HT may support a sample holder tray such as tray 114 shown in FIG. 3A for holding sample holders or may support sample holders directly. FIGS. 3A, 3B are respectively the top and side views of tray 114. Therefore, translator HT may deliver tray 114 horizontally to a location suitable for pick-up by one or more vertical translator VT. Preferably, a mirror may be placed on the end of the horizontal translator HT to provide a view of the top portions of the sample holders. In this manner, the orientation of the sample holder ramps (discussed below) can be monitored during sample approach. The vertical translator VT is connected to a sample clamp or claw assembly SC which is adapted to pick up a sample holder holding the sample and deliver and release the holder and sample at different vertical locations. The devices IS, MS, LEED/AES and H are all located in the vacuum chamber 102 such that they can be used conveniently for heating, cleaning, or otherwise characterizing the sample in the chamber while the sample and holder are being held by SC and a vertical translator VT. The LT ACSTM is also located so that the translator VT is positioned to move SC to a location suitable for use with the LT ACSTM as described below. The RT ACSTM is operated in a similar manner but uses a different vertical translator, claw assembly SC' and sample elevator SE'. After a sample has been studied using one or more of the above listed equipment, it is delivered by VT and SC to the container (or another location) and a different sample in a holder are picked up from the container (or another location) by VT and SC for a study process similar to that described above.

Vertical translator VT may include magnetic type feedthroughs such as the Surface/Interface model DBLRP-XX or DBLRM-XX and DBDAG and BHRSS from Surface/Interface Inc. of Mountain View, Calif. DBLRP-XX enables up and down linear motion as well as rotary motion to open and close the claw in SC. DBDAG allows tilting and BHRSS enables rotational motion of the sample and sample holder with respect to instruments for aligning the sample and holder with respect to the instruments. The horizontal translator HT may be a Surface/Interface DBLRP-XX also from Surface/Interface Inc. of Mountain View, Calif. The vertical translator may also be implemented using a bellows-type mechanism such as the OMNIAX MYZ with RD2S from Fisons-Vacuum Generator of Hastings, East Sussex, U.K.

In reference to FIGS. 3A, 3B, sample holder tray 114 defines chambers 116 therein which are somewhat larger (e.g by 20%) in diameter than the sample holders to allow room for the sample claw or clamp assembly to retrieve the sample holders from the chambers or to deposit the holders therein. Where chamber 102 contains a detector 122 for point-source shadow imaging, field emission microscopy, field ion microscopy, or atom probe, the vertical translator VT would be useful for transporting the detector to different locations. FIG. 4 is a schematic view of detector 122 for point-source shadow imaging. For this purpose, detector 122 is placed by VT at a suitable location relative to the sample holder 130, sample 132, and source 124 for point-source imaging. For field emission microscopy, field ion microscopy, or atom probe microscopy, FIG. 4 would be modified in that no sample 132 or sample holder 130 would be present. For this purpose, detector 122 is placed by VT at a suitable location relative to the source 124 for field emission microscopy, field ion microscopy, or atom probe microscopy.

FIGS. 5A, 5B are respectively a cross-sectional view and a bottom view of sample holder 130 and sample 132. As shown in FIGS. 5A, 5B, sample holder 130 is a housing defining a hole 130a therein exposing a surface 132a of the sample to be cleaned, characterized, detected and analyzed. Housing 130 also has another hole 130b on the other side exposing the backside 132b of the sample. The sample 132 is kept in place within holder 130 by means of a spring 134 which is of a size preferably much smaller than hole 130b so that backside 132b of the sample is visible and accessible for performing various operations such as heating. As shown in FIG. 5B, the bottom surface of holder 130 has three ramps where each ramp would drop off to the next at a ridge 130d. As described in the articles by Frohn et al. and Besocke referenced above, the ramps are useful for a "walking" process for adjusting the distance between the sample and the tip of the STM. While essentially the same "walking" process so described may be employed here, to compensate reduction of piezo gain for low temperature operation, the peak height of the waveform used during the "walking" process for LT ACSTM may be about 85 volts instead of about 35 volts for RT ACSTM.

FIG. 6 is a schematic view of a portion of an STM 150, sample holder 130, an optional mirror 154, and light source 156 for positioning the sample holder 130 with respect to the STM 150. Light source 156 and mirror 154 may be but are not required to be placed within chamber 102. Sample holder 130 is of the type shown in the above-referenced papers by Frohn et al. and Besocke. It will be noted that the bottom surface of holder 130 has three ramps for performing the "walking" process. As shown in FIG. 6, surface 130a of the holder has at least one mark 130b thereon so that reflection of light from surface 130a and the mark originating from source 156 and mirror 154 can be observed via mirror 154 to aid in the positioning of the holder 130 by means of the vertical translator VT and sample claw or clamp SC. Rotary motion of the holder by means of VT or STM 150 by reference to mark 130b allows for proper alignment of the sample holder ramps at the starting position for approach on the beetle-style STM tripod comprising three tubes 22, 28. Lateral motion of the holder caused by SE (discussed below) or STM can be monitored through this arrangement as well. Mirror 154 may be omitted where light from source 156 can be directed directly to surface 130a and reflection of light from surface 130a can be observed directly without reflection through mirror 154.

Where sample cleaning and/or characterization are desirable, translators VT, HT and SC are used to pick up a sample holder and sample from tray 114 and deliver them to a location suitable for heating, sputtering, mass or electron spectroscopy as described above. Where such cleaning and/or characterization are not necessary, the translators and SC would simply pick up a sample and sample holder from the tray and deliver them to the LT ACSTM. If the sample is to be delivered to the RT ACSTM, a different vertical translator and SC' may be used instead in conjunction with HT. The process and mechanism for delivering the sample holder to the LT ACSTM will be described below, it being understood that the mechanism and process for delivery and alignment to the RT ACSTM is similar. While the above described preparing step (cleaning, checking crystallinity, characterizing etc.) is described as useful before sample surface detection and analysis, it will be understood that such preparation may also be useful during or after detection and analysis; all such variations are within the scope of the invention.

FIG. 7A is a partial cutaway perspective view of a portion of the vertical translator and SC and of a sample elevator SE. As shown in FIG. 7A, VT has a tube 172 into which the sample claw assembly SC is placed. The actuation of DBLRP-XX of VT will cause the claw assembly SC to open or close in order to pick up or release a sample holder. The DBLRP-XX in VT will also cause SC to slide within the tube 172 to within an appropriate distance to the LT ACSTM. The last leg of the journey of the sample holder to the LT ACSTM is then accomplished using a sample elevator SE (or SE' for RT ACSTM) as described below. The advantage of using a separate stage SE is to shield the LT ACSTM from the claw assembly SC and from accidental dropping of the holder. SE also permits fine tuning in alignment of the holder to the ACSTM.

SE has a plate 174 having a funnel-shaped hole 174a therein for holding a sample holder, shown more clearly in FIG. 7B, which is a cross-sectional view of the plate 174 and holder 130 shown in phantom. When SC releases a sample holder at a location in the hole 174a, the holder is placed in the hole and is held and centered therein because of the funnel shape of the hole. The plate 174 is then lowered with respect to the LT ACSTM until the holder touches and is supported by the ACSTM. To remove the sample after detection, the plate 174 is raised, so that it retrieves the holder from the location in contact with and on top of the ACSTM. SC is moved down by means of VT to grab the holder from hole 174a to transport it to tray 114. Even if the sample has been joined to the probe tip of the ACSTM, the sample can still be retrieved by raising the plate 174.

As shown in FIG. 7A, the tube 172 is connected to a top plate 182 of SE so that the claw assembly SC is directly above hole 174a, where the tube 172 guides the claw assembly 170 towards the hole. The claw assembly SC is equipped with guiding wheels 184 adapted to contact tube 172 for smoothly guiding the claw assembly along the tube. The mechanism for raising or lowering plate 174, in the preferred embodiment, comprises a rotary mechanism 186 and screw 188 connected to plate 174. Alternatively, a linear feedthrough 186 having a rod 188 may be employed instead of a rotary mechanism and screw to raise and lower plate 174. In the preferred embodiment as shown in FIG. 7A, elevator SE includes a platform 190 for supporting the LT ACSTM and a connector such as screw 188 for connecting the platform to the plate 174, where hole 174a is positioned so as to center the holder with respect to the LT ACSTM.

Sometimes after the sample holder is deposited on top of the LT ACSTM, it is found that the sample holder is off its correct position with respect to the LT ACSTM. In such event, the sample holder can be repositioned by picking up the holder by means of the elevator SE so that the centering action of the funnel shape of the hole may cause it to be positioned correctly. The elevator then is used to lower the holder onto the ACSTM. Alternatively, after the holder is lifted by plate 174 of the elevator SE, it can be picked up by a claw assembly SC and rotated by using the DBLRP-XX of the VT before it is again deposited into hole 174a. Then plate 174 is again lowered to deposit the holder onto the LT ACSTM.

While discussed above is a system for centering and/or aligning the sample and sample holder with respect to an ACSTM, it will be understood that the system can also be used for centering and/or aligning the sample and sample holder with respect to a conventional STM, another form of scanning probe microscope, or other instruments.

FIG. 8 is an enlarged view of a portion of the embodiment in FIG. 7A. As shown in FIG. 8, the claw assembly SC includes two elongated claw members 202 and 204. Members 202,204 are rotatably connected to a tube inside cylinder 209 through a support structure 203 at pivot point 205, and cylinder 209 is free to rotate. VT also includes a piston assembly 206 and connectors 208 connecting the piston assembly to the claw members 202, 204 at pivot points 202a, 204a so that linear motion of the piston assembly 206 relative to cylinder 209 will cause the claw members 202, 204 to move apart in order to release a sample holder or to move towards each other to grab and pick up a sample holder. Linear motion of the piston assembly 206 is caused by motion of center shaft 207 of FIGS. 9A, 9B; the motion of shaft 207 may be caused in turn by OMNIAX RD2S from Fisons-Vacuum Generator. A rotary motion mechanism generated by using DBLRP-XX with gears or cams can also be used to actuate piston 206 and thus the claw assembly by moving members 202, 204 closer together or apart.

FIG. 9A shows in more detail the piston assembly 206 of VT and the claw assembly showing the claw members in a closed position holding a sample holder. FIG. 9B shows the piston assembly and claw assembly of FIG. 9A but with the claw members in an open position thereby releasing holder 130. The cylindrical aperture of the claw members corrals the sample holder during retrieval. FIG. 9C is a cross-sectional view of a curved portion of claw member 202 taken along the line 9C—9C in FIG. 9A. As shown in FIGS. 9A, 9B, the piston assembly 206 includes springs 210 for spring loading the claw members 202, 204 to a predetermined range of clamping strengths. As shown in FIG. 9C, each of the claw members includes a beveled portion (which faces the beveled portion of the other claw member) so that a sample holder may be held therein when the beveled portions are moved onto the holder. The position of the holder 130 relative to claw member 202 is shown in phantom in FIG. 9C. Therefore the beveled portion of each of the claw members guides the claw members over the sample holder when the members move over the holder so as to grab it.

FIGS. 10A, 10B are respectively a cross-sectional and bottom view of a sample holder suitable for use with an ACSTM. As described above by reference to FIG. 1, in certain ACSTM applications, it may be necessary to transmit a microwave signal from the sample to an analyzer. As shown in FIG. 10A, the sample holder 250 of FIGS. 10A, 10B differs from holder 130 of FIGS. 5A, 5B in that holder 250 further includes a microwave transmission line such as a microstrip 252 in contact with or in close proximity to the back surface 132b of the sample and a second microwave transmission line 254 in contact with line 252 and having a portion such as microstrip 254a on the bottom surface of the holder 250, where portion 254a is on the same side as the sample surface 132a to be detected. As shown in FIG. 10B, microstrip 254a extends across one of the ramps on the bottom surface of the holder.

The manner in which a signal from the sample may be detected by the ACSTM is illustrated in FIG. 11. As shown in FIG. 11, ACSTM 260 has one or more piezoelectric tubes 270 each terminating in a ball 272 and a piezoelectric tube 280 terminating in a microwave probe 282. Therefore, when holder 250 is placed in contact with ball 272 and probe 282, probe 282 will contact portion 254a so that the signal from the sample 132 will be transmitted through lines 252, 254 to probe 282.

FIG. 12 is a perspective view of an ACSTM 300 with two coaxial cables 301, 302 and a sample holder 130. The four piezo assemblies of the ACSTM 300 are somewhat similar in structure to those of the existing STM described in the articles referenced above by Frohn et al. and Besocke, except that the piezo assemblies of ACSTM 300 are adapted to transmit microwave signals whereas the center tube of the existing STM is adapted for transmitting direct current with the peripheral tubes grounded. Where reflection of the signal from the sample is detected instead of the transmitted signal from the sample, cable 301 is used both for signal deliverance to the sample and for sending the reflected signal back to the analyzer, so that cable 302 is not used and can be omitted.

The structure of the piezo tubes of ACSTM 300 is shown more clearly in FIG. 13. While FIG. 13 shows the structure of a peripheral piezo assembly, it will be understood that the center piezo assembly has a similar structure. Microwave losses are minimized by using semi-rigid coaxial cable 302 (and 301 in FIG. 12). These coaxial cables are terminated inside concentric tubes 310, 312 where the inner tube 310 also acts as tip or bearing holder and sample connection. The microwave coaxial cable 302 has a small section of outer tube shielding 304 removed. A smaller section of Teflon insulation 306 is also removed to expose the center conductor 308. In this way, the center conductor 308 mates with and is in electrical contact with the inner tube 310 while the outer conductor 304 mates with and is in electrical contact with the outer tube 312 as shown in FIG. 13. The extension of the insulation 306 from the outer shield of the cable past the inner tube prevents accidental grounding between the inner tube and the cable shielding. In reference to FIGS. 12, 13, for the center piezo assembly, the STM tip terminal 344 is placed in the coaxial tube 310 that is housed in the center piezo assembly or scanner. The other coaxial tube is housed in one of the three peripheral piezo assemblies that make up the tripod and is terminated with a metal (e.g. stainless steel) ball 272 (pick-up terminal) through which contact to the sample is made. As shown in FIG. 12, the coaxial cable 301 connects the tip terminal of the microscope 300 to a microwave signal source 320 and coaxial cable 302 connects at least one of the remaining three piezo assemblies to an analyzer 352. While the invention is described with the AC signal applied to the tip terminal 344, and the detected signal obtained from pick-up terminal 272, it is possible to apply the AC signal instead to "pick-up terminal" 272 and obtain the detected signal from the tip terminal. All such variations are within the scope of the invention.

FIGS. 14A, 14B illustrate respectively the open and closed positions of heater block H of FIG. 1. As shown in FIGS. 14A, 14B, heater block H includes a clamp assembly 402 for holding the heater 400 and a sample holder 130. The assembly 402 includes a mechanism for controlling the clamping of the heater to the holder. The assembly includes arm 404 for holding the heater and 406 for holding the holder. Spring 405 urges the two arms together unless they are pulled apart. Assembly 402 is mounted on a dual linear/rotary feedthrough 420 including a linear motion feedthrough 422 for moving and centering the assembly 402 for sample exchange or relative to an analytical instrument. A suitable feedthrough that can be used for such purpose is MDC LMT-152, or MDC LMT-154 from MDC of Hayward, Calif. Another linear or rotary motion feedthrough 424 moves a rod (not shown) in cylinder 430 in order to cause assembly 402 to open against the action of spring 405 or to close. The optional rotary motion feedthrough 426 can be used properly to orient the sample in the holder for ion sputtering with simultaneous heating or for surface analysis while heating. A suitable part for feedthroughs 424, 426 is MDC BRLM-275 from MDC of Hayward, Calif.

The heater element 400 may be electrically isolated from the rest of the heater stage using an electrically insulating arm 404. Where the heater is an electron beam heater, insulating spacer 450 shown in phantom in FIG. 14A may be employed to maintain a bias electrical potential difference between the heater and the sample holder to transport electrons from the heater to the holder. Electrical isolation of the sample and sample holder also provides a means for measuring ion current to the sample while sputtering. The heater elements can be a potted heater which heats the sample by conduction and electromagnetic radiation up to about 900 degrees Centigrade or a cathode for electron beam heating up to higher temperatures. Temperatures of the sample can be monitored using a thermocouple (not shown) clamped into the assembly or using an infrared or optical pyrometer 470 which might or might not be in the vacuum chamber. When a sample holder 130 of FIGS. 5A, 5B is placed in arm 406 with the backside of the sample 132b facing the heater, the hottest parts of the heater remain behind the sample to minimize sample contamination. The configuration of the sample holder 130 of FIGS. 5A, 5B allows optical access as well as access by vacuum surface and analytical equipment during sample heating.

While the invention has been described by reference to different embodiments, it will be understood that various changes and modifications may be made without departing from the scope of the inventing, which is to be limited only by the appended claims.

What is claimed is:

1. An apparatus for analyzing surfaces of samples, comprising:
   a vacuum chamber;
   at least one surface analytical instrument in the chamber;
   at least one sample holder each for holding a sample in the chamber; and device means in the chamber for picking up a sample holder holding a sample and placing the holder at a location for use with said at least one instrument, and for picking up said sample holder holding the sample located for use with the at least one instrument and placing the holder at a predetermined location, so that the device means is adapted for transporting, in the chamber, sample holders and samples between the predetermined location and the location for use with the instrument;

wherein said device includes a vertical translator for moving a sample holder up or down, said translator including:

a piston assembly; and a claw assembly for picking up and depositing a sample holder, said claw assembly including two elongated claw members, and connectors connecting the piston assembly and the claw members at pivot points, so that linear motion of the piston assembly will cause the claw members to move apart in order to release a sample holder or to move towards each other to pick up a sample holder.

2. The apparatus of claim 1, wherein the claw members each includes a curved portion shaped to contain a sample holder between the curved portions of the claw members.

3. The apparatus of claim 2, wherein the curved portion of each of the claw members includes a beveled portion facing the beveled portion of the other claw member for guiding the claw members over a sample holder when the claw members are moved over the holder so as to grab the sample holder.

4. The apparatus of claim 1, wherein the piston assembly includes a spring for spring loading the claw members to provide a predetermined range of clamping strengths of the claw members.

5. The apparatus of claim 1, wherein said device means includes a rotary mechanism for rotating a sample holder with respect to the instrument.

6. The apparatus of claim 1, wherein said device means include, in the chamber, a horizontal translator for transporting a container in the chamber.

7. The apparatus of claim 6, further comprising cooling means for cooling said at least one instrument.

8. The apparatus of claim 1, said at least one instrument further comprising a device for atom, molecule or ion scattering, for mass spectroscopy, for electron spectroscopy, or for heating a sample.

9. The apparatus of claim 1, wherein said at least one instrument is a scanning probe microscope.

10. The apparatus of claim 1, wherein at least one of said sample holders has at least one mark thereon.

11. The apparatus of claim 10, said apparatus further comprising a light source for illuminating the at least one holder having the at least one mark thereon.

12. The apparatus of claim 1, wherein exterior shape of said holder is cylindrical, said apparatus further comprising a container having cylindrical chambers therein each for holding the sample holder, said chamber having a larger diameter than the holder.

13. The apparatus of claim 1, further comprising a plurality of additional surface analytical instruments.

14. The apparatus of claim 1, further comprising a container in the chamber for containing the sample holder.

15. An apparatus for analyzing surfaces of samples, comprising:

a vacuum chamber;

at least one surface analytical instrument in the chamber;

at least one sample holder each for holding a sample in the chamber;

device means in the chamber for picking up a sample holder holding a sample and placing the holder at a location for use with said at least one instrument, and for picking up said sample holder holding the sample located for use with the at least one instrument and placing the holder at a predetermined location, so that the device means is adapted for transporting, in the chamber, sample holders and samples between the predetermined location and the location for use with the instrument; and sample elevator means located above the instrument, to shield the at least one instrument from the device means.

16. The apparatus of claim 15, wherein said elevator means includes a plate with a funnel-shaped hole therein for holding a sample holder, so that when the device means places the holder in the hole in the plate and releases the holder, the holder is held therein.

17. The apparatus of claim 16, wherein said elevator means includes a mechanism means for raising or lowering the plate with respect to the at least one instrument in order to place a sample holder holding a sample on top of the at least one instrument and to remove the sample holder holding a sample from on top of the instrument.

18. The apparatus of claim 17, wherein said mechanism means includes a rotator and a screw.

19. The apparatus of claim 16, wherein said device means includes a tube and a claw assembly in the tube, said tube being connected to the elevator means so that the claw assembly is directly above the hole in the plate, said tube guiding the claw assembly towards the hole.

20. The apparatus of claim 19, wherein said claw assembly has guiding wheels adapted to contact the tube for smoothly guiding the claw assembly along the tube.

21. The apparatus of claim 16, wherein said elevator means includes a platform for supporting the at least one instrument and a connector means for connecting the platform to the plate, said hole in said plate being positioned so as to center the holder with respect to the instrument.

22. The apparatus of claim 21, wherein said connector means includes mechanism means for raising or lowering the plate with respect to the instrument.

23. An apparatus for analyzing surfaces of samples, comprising:

a vacuum chamber;

a scanning probe microscope in the chamber;

at least one sample holder each for holding a sample in the chamber; and device means in the chamber for picking up a sample holder holding a sample and placing the holder at a location for use with said microscope, and for picking up said sample holder holding the sample located for use with the microscope and placing the holder at a predetermined location, so that the device means is adapted for transporting, in the chamber, sample holders and samples between the predetermined location and the location for use with the microscope; wherein said scanning probe microscope is an AC scanning tunneling microscope, said apparatus further comprising;

at least one microwave signal source and one analyzer outside the chamber; and one or more coaxial cables connecting the source and analyzer to the AC scanning tunneling microscope in the chamber.

24. An apparatus for analyzing surfaces of samples, comprising:

a vacuum chamber;

a scanning probe microscope in the chamber;

at least one sample holder each for holding a sample in the chamber;

device means in the chamber for picking up a sample holder holding a sample and placing the holder at a location for use with said microscope, and for picking up said sample holder holding the sample located for use With the microscope and placing the holder at a predetermined location, so that the device means is adapted for transporting, in the chamber, sample holders and samples between the predetermined location and the location for use with the microscope; and a detector in the chamber for point-source shadow imaging, field emission spectroscopy, field ion spectroscopy or atom probe, wherein said device means is suitable for removing or placing said detector from or at a predetermined location relative to the instrument.

25. A method for analyzing surfaces of samples, comprising the steps of:

placing at least one analytical instrument in a vacuum chamber;

picking up a sample holder holding a sample in the chamber;

placing the holder at a location for use with said at least one surface analytical instrument in the chamber, said placing step including the step of rotating the bolder with respect to the instrument in order to align the holder with the instrument; and detecting and analyzing a surface of the sample in the chamber using the instrument.

26. The method of claim 25, wherein the location is above the instrument, said step of placing including the step of depositing the holder holding the sample onto a sample elevator.

27. The method of claim 26, wherein said sample elevator has a funnel-shaped hole over the instrument, and wherein said depositing step deposits the holder holding the sample into the hole, said placing step further comprising the step of picking up the holder and the sample from said funnel-shaped hole and re-depositing the holder and sample into the hole when the holder is not aligned With the instrument after the depositing step.

28. The method of claim 26, said method further comprising, prior to the detection and analysis of the sample surface, the step of lowering the sample elevator until the sample holder is in contact with the instrument.

29. The method of claim 28, said method further comprising, after the detection and analysis of the sample surface, the step of raising the sample elevator until the sample holder is no longer in contact with the instrument.

30. The method of claim 29, wherein the placing step includes the step of picking up the holder and the sample from the sample elevator.

31. A method for analyzing surfaces of samples, comprising the steps of:

placing at least one analytical instrument in a vacuum chamber;

picking up a sample holder holding a sample in the chamber;

placing the holder at a location for use with said at least one surface analytical instrument in the chamber by delivering means, said placing step including the step of shielding the instrument from said delivering means; and detecting and analyzing a surface of the sample in the chamber using the instrument.

32. A method for analyzing surfaces of samples, comprising the steps of:

placing at least one analytical instrument and an elevator in a vacuum chamber, said elevator having a funnel-shaped hole therein, so that the hole is located above the instrument;

picking up a sample holder holding a sample in the chamber;

depositing the holder into a funnel-shaped hole of the elevator so as to align the sample with the instrument; and detecting and analyzing a surface of the sample in the chamber using the instrument.

33. The method of claim 32, wherein after the holder is deposited in the hole, the sample is at a distance to the instrument, said method further comprising the step of lowering the elevator to reduce the distance between the sample and the instrument.

34. The method of claim 32, further comprising the steps of:

picking up the holder from the hole when the sample is not aligned with the instrument after the depositing step; and re-depositing the holder into the hole.

35. An apparatus for analyzing surfaces of samples, comprising:

a vacuum chamber;

at least one surface analytical instrument in the chamber;

at least one sample holder each for holding a sample in the chamber; and device means in the chamber for picking up a sample holder holding a sample and placing the holder at a location for use with said at least one instrument, and for picking up said sample holder holding the sample located for use with the at least one instrument and placing the holder at a predetermined location, so that the device means is adapted for transporting, in the chamber, sample holders and samples between the predetermined location and the location for use with the instrument; and elevator means including a plate with a funnel-shaped hole therein for holding the sample holder above the instrument and for shielding the instrument from the device means, so that when the device means places the holder in the hole in the plate and releases the holder, the holder is held therein.

36. The apparatus of claim 35, wherein said hole in the plate is aligned with the instrument so that when the holder is in the hole, the sample is substantially aligned with instrument.

* * * * *